United States Patent
Zhang et al.

(10) Patent No.: US 12,408,474 B2
(45) Date of Patent: Sep. 2, 2025

(54) CONTACTS OF SOLAR CELLS AND OTHER OPTOELECTRONIC DEVICES

(71) Applicant: ARIZONA BOARD OF REGENTS ON BEHALF OF ARIZONA STATE UNIVERSITY, Scottsdale, AZ (US)

(72) Inventors: Yong-Hang Zhang, Scottsdale, AZ (US); Xin Qi, Tempe, AZ (US); Zheng Ju, Tempe, AZ (US); Jia Ding, Tempe, AZ (US); Tyler McCarthy, Scottsdale, AZ (US); Stephen Schaefer, Scottsdale, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 18/151,341

(22) Filed: Jan. 6, 2023

(65) Prior Publication Data
US 2023/0215961 A1      Jul. 6, 2023

Related U.S. Application Data

(60) Provisional application No. 63/297,111, filed on Jan. 6, 2022.

(51) Int. Cl.
*H10F 77/20* (2025.01)
*H10F 71/00* (2025.01)

(52) U.S. Cl.
CPC ........... *H10F 77/211* (2025.01); *H10F 71/00* (2025.01)

(58) Field of Classification Search
CPC ..... H01L 31/022466; H01L 31/022425; H01L 31/0322; H01L 31/03925; H01L 31/073;
(Continued)

(56) References Cited

U.S. PATENT DOCUMENTS

| | | | |
|---|---|---|---|
| 11,063,164 B1 * | 7/2021 | Engel | H01L 31/078 |
| 2015/0255661 A1 * | 9/2015 | Liang | H01L 31/068 |
| | | | 438/513 |
| 2020/0157125 A1 * | 5/2020 | Irwin | H10K 10/478 |

FOREIGN PATENT DOCUMENTS

WO    WO-2017172962 A1 * 10/2017 ..... H01L 31/022475

OTHER PUBLICATIONS

Yu Zhang, Ping Su, Linqing Liu, Pengfei Qiu, Li Su, Guangsheng Fu, Wei Yu, The effect of MoS2 modulated doping with molybdenum-oxide on the photovoltaic performance for MoS2/n-Si heterojunction solar cells, Solar Energy 208 (2020) 1048-1057. (Year: 2020).*

(Continued)

*Primary Examiner* — Mayla Gonzalez Ramos
(74) *Attorney, Agent, or Firm* — MH2 Technology Law Group LLP

(57) ABSTRACT

Contacts for solar cells and other optoelectronic devices are provided. Embodiments described herein take advantage of the surface Fermi level pinning effect to build an electrical field inside of a semiconductor to extract or inject carriers for solar cells, photodetectors, and light-emitting device applications. For example, n-type or p-type two-dimensional (2D) materials can be used in contact with an n-type semiconductor to form a "p-region" so that a p-n junction, or an i-n or n-n+ junction can be constructed. Similarly, n-type or p-type 2D materials can be used in contact with a p-type semiconductor to form an "n-region" so that an n-p junction, or an i-p or p-p+ junction can be constructed. These structures can provide sufficiently high electrical field inside the semiconductor to extract photogenerated carriers in solar cells and photodetectors or inject minority carriers for light-emitting devices.

19 Claims, 9 Drawing Sheets

(58) Field of Classification Search
CPC . H01L 31/0749; H01L 31/18; H01L 31/1804; H01L 31/1828; H01L 31/186; H01L 29/1606; H10F 71/00; H10F 77/211
See application file for complete search history.

(56) References Cited

OTHER PUBLICATIONS

Zhao et al. Monocrystalline CdTe solar cells with open-circuit voltage over 1 V and efficiency of 17%, Nat. Energy 1, 16067, 2016, 22 pages.
Becker et al., Loss Analysis of Monocrystalline CdTe Solar Cells With 20% Active-Area Efficiency, IEEE J. Photovoltaics, 99, 2017, pp. 1-6.
Becker et al., Monocrystalline CdTe/MgCdTe double-heterostructure solar cells with ZnTe hole contacts, IEEE J. Photovoltaics, 7, 2016, pp. 307-312.
Sun et al., Band alignment of two-dimensional metal monochalcogenides MXs (M=Ga,In;X=S,Se,Te), AIP Advances, 7, 095120, 2017, 6 pages.
Woods-Robinson et al., Wide Band Gap Chalcogenide Semiconductors, Chem. Rev., 120, 2020, pp. 4007-4055.
Dreon et al. 23.5%-efficient silicon heterojunction silicon solar cell using molybdenum oxide as hole-selective contact, Nano Energy, 70, 104495, 2020, 8 pages.
Zhou et al., Large Area Growth and Electrical Properties of p-Type WSe2 Atomic Layers, Nano Lett. 2015, 15, 1, pp. 709-713.
Battaglia et al., Hole Selective MoOx Contact for Silicon Solar Cells, Nano Lett . 14, 2014, pp. 967-971.
Swanson et al. CdCI2 passivation of polycrystalline CdMgTe and CdZnTe absorbers for tandem photovoltaic cells, J. Appl. Phys. 123, 203101, 2018, 11 pages.
Becker et al., Monocrystalline 1.7-eV-bandgap MgCdTe solar cell with 11.2% efficiency, IEEE Journal of Photovoltaics, vol. 8, No. 2, Mar. 2018, pp. 581-586.
Becker et al., CuZnS hole contacts on monocrystalline CdTe solar cells, IEEE Photovoltaic Specialist Conference, 2017, pp. 3410-3412.
Chen et al., The unique photocatalysis properties of a 2D vertical MoO2/WO2 heterostructure: a first principles study, Journal of Physics D: Applied Physics, 51, 265106, 2018, 7 pages.
Kang et al., Band offsets and heterostructures of two-dimensional semiconductors, Applied Physics Letters, 102, 012111, 2013, 5 pages.
Metzger et al., Exceeding 20% efficiency with in situ group V doping in polycrystalline CdTe solar cells, Nature Energy, vol. 4, Oct. 2019, pp. 837-845.
Burst et al., CdTe solar cells with open-circuit voltage breaking the 1 V barrier, Nat. Energy 1, 16015, 2016, 8 pages.

\* cited by examiner

CONTACTS OF SOLAR CELLS AND OTHER OPTOELECTRONIC DEVICES

CROSS-REFERENCE TO RELATED APPLICATION

This application claims the priority and benefit of U.S. Provisional Application No. 63/297,111, filed on Jan. 6, 2022, which is hereby incorporated by reference in its entirety.

GOVERNMENT SUPPORT

This invention was made with government support under FA9453-20-2-0011 awarded by the Air Force Research Laboratory. The government has certain rights in the invention.

TECHNICAL FIELD

The present disclosure relates to semiconductor devices, and in particular to solar cells and other optoelectronic devices.

BACKGROUND

It is known that many semiconductors cannot be easily doped either n-type, p-type, or both using conventional methods of introducing dopants into the semiconductors. It is also known that semiconductor surfaces and certain interfaces have many electronic states caused by dangling or unsaturated bonds on the surface or at the interface. These states typically have a very broad spread in energy. For covalent semiconductors, many of these states are inside of the forbidden gap. Therefore, metal contacts to these semiconductor interfaces may have the so-called "Fermi level pinning" effect due to the high density of these states and misalignments of the Fermi levels between the contact metal and the semiconductor.

As one example, the group II-VI binaries and their alloys, (BeMgZnCdHg)(SSeTe), have a very broad application in optoelectronic devices such as thin-film solar cells, photodetectors ranging from ultraviolet (UV) to longwave infrared (IR), and radiation detectors for x-rays, γ-rays, and neutrons, etc. One of the main challenges for this mature material system is the difficulty of achieving high quality n- and p-type doping simultaneously. For instance, zinc telluride (ZnTe) and cadmium selenide (CdSe) can be easily doped p-type but not n-type, while cadmium telluride (CdTe) and mercury cadmium telluride (HgCdTe) are easily doped n-type but not p-type. This challenge has made it difficult to make either electron or hole ohmic contacts to these materials, which are critical elements of electronic and optoelectronic devices.

SUMMARY

Contacts for solar cells and other optoelectronic devices are provided. Embodiments described herein take advantage of the surface Fermi level pinning effect to build an electrical field inside of a semiconductor to extract or inject carriers for solar cells, photodetectors, and light-emitting device applications. For example, n-type or p-type two-dimensional (2D) materials can be used in contact with an n-type semiconductor to form a "p-region" so that a p-n junction, or an i-n or n-n+ junction can be constructed. Similarly, n-type or p-type 2D materials can be used in contact with a p-type semiconductor to form an "n-region" so that an n-p junction, or an i-p or p-p+ junction can be constructed. These structures can provide sufficiently high electrical field inside the semiconductor to extract photogenerated carriers in solar cells and photodetectors or inject minority carriers for light-emitting devices.

A set of 2D materials are identified to provide the above-described semiconductor devices. Indium tin oxide (ITO) can be put on top of these 2D materials to form practical contacts. Due to high doping concentrations, the ITO and the 2D materials (either n- or p-type) will form an ohmic contact through an n-n junction of an n-p tunnel junction. The non-metallic contacts can be transparent and enable bifacial thin film solar cells, such as with cadmium telluride (CdTe).

An exemplary embodiment provides an optoelectronic junction. The optoelectronic junction includes a thin-film doped semiconductor and a 2D material deposited at an interface of the thin-film doped semiconductor and forming the optoelectronic junction using Fermi level pinning.

Another exemplary embodiment provides a method for forming a thin-film optoelectronic device. The method includes providing a thin-film doped semiconductor and depositing a 2D material over an interface of the thin-film doped semiconductor to form an optoelectronic diode junction.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
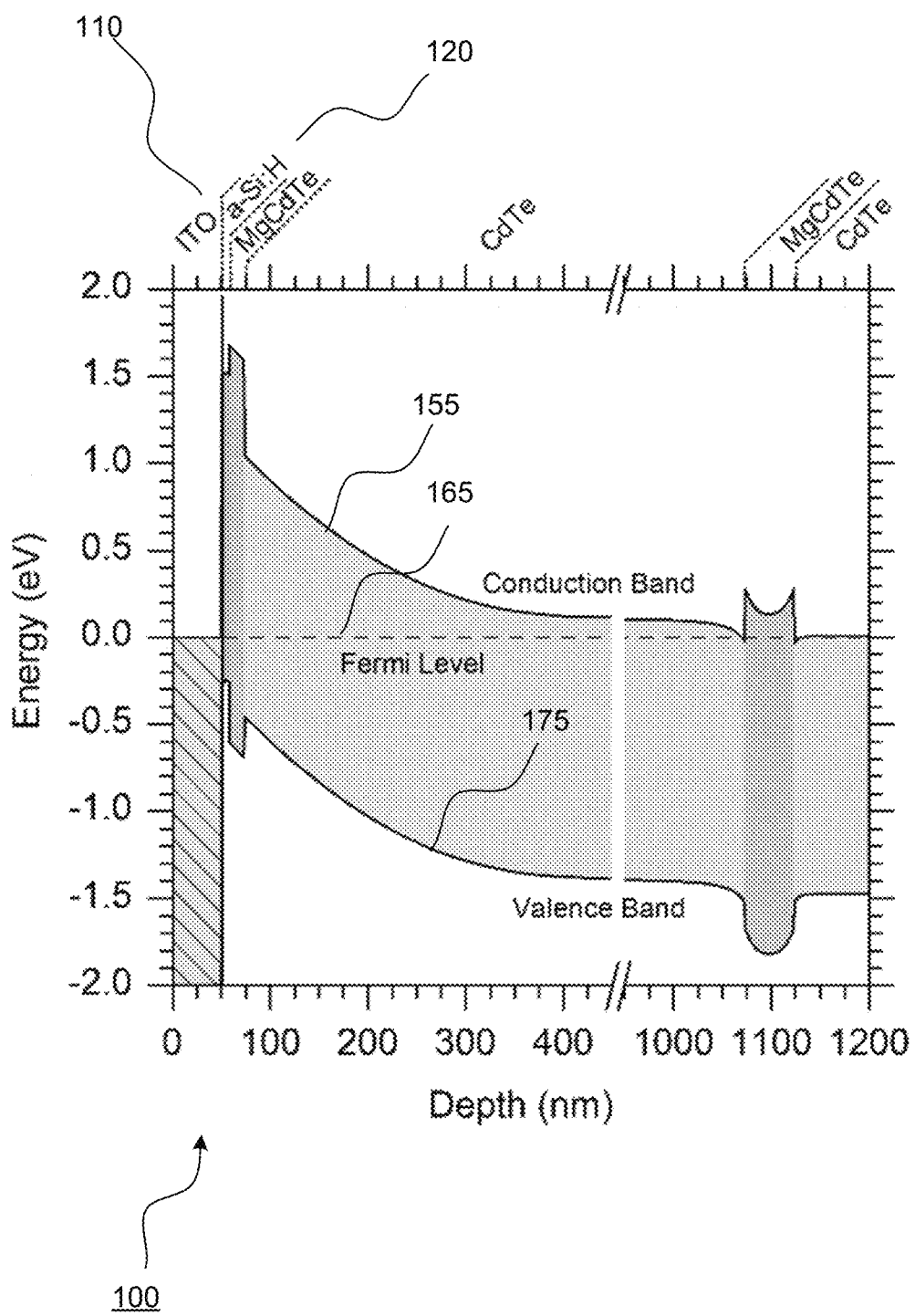
FIG. 1 depicts a band diagram of a crystalline cadmium telluride (CdTe) solar cell using a CdTe/magnesium cadmium telluride (MgCdTe) double-heterostructure (DH) design.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Contacts for solar cells and other optoelectronic devices are provided. Embodiments described herein take advantage of the surface Fermi level pinning effect to build an electrical field inside of a semiconductor to extract or inject carriers for solar cells, photodetectors, and light-emitting device applications. For example, n-type or p-type two-dimensional (2D) materials can be used in contact with an n-type semiconductor to form a "p-region" so that a p-n junction, or an i-n or n-n+ junction can be constructed. Similarly, n-type or p-type 2D materials can be used in contact with a p-type semiconductor to form an "n-region" so that an n-p junction, or an i-p or p-p+ junction can be constructed. These structures can provide sufficiently high electrical field inside the semiconductor to extract photogenerated carriers in solar cells and photodetectors or inject minority carriers for light-emitting devices.

A set of 2D materials are identified to provide the above-described semiconductor devices. Indium tin oxide (ITO) can be put on top of these 2D materials to form practical contacts. Due to high doping concentrations, the ITO and the 2D materials (either n- or p-type) will form an ohmic contact through an n-n junction of an n-p tunnel junction. The non-metallic contacts can be transparent and enable bifacial thin film solar cells, such as with cadmium telluride (CdTe).

I. Introduction

Embodiments described herein use a novel set of n-type and p-type materials in combination with surface or interface states of semiconductor materials to form a "pinned" Fermi level substantially above the valence band edge (or below the conduction band edge) for n-type (p-type) contact for optoelectronic devices.

In an exemplary aspect, embodiments take advantage of the surface Fermi level pinning effect to build an electrical field inside of a semiconductor to extract or inject carriers for solar cells, photodetectors, and light-emitting device applications. The use of either n-type or p-type 2D materials in contact with an i) n-type or ii) p-type semiconductor to form i) a "p-region" with an n-type semiconductor so that a p-n junction, or an i-n or n-n+ junction can be constructed; or ii) an "n-region" with a p-type semiconductor so that an n-p junction, or an i-p or p-p+ junction with sufficiently high electrical field inside the semiconductor to extract photogenerated carriers in solar cells and photodetectors or inject minority carriers for light-emitting devices.

A set of 2D materials are identified to enable the ideas described above. ITO can be put on top of these 2D materials to form practical contacts. Due to high doping concentrations, the ITO and the 2D materials (either n- or p-type) will form an ohmic contact through an n-n junction of an n-p tunnel junction.

Some embodiments use n+-type ITO on an n-type mercury cadmium telluride (MgCdTe)/CdTe double-heterostructure (DH) sample to form a junction with high built-in voltage $V_{bi}$ and open circuit voltage $V_{oc}$. This structure combines the n-type 2D materials with ITO. The feasibility of this concept has been experimentally demonstrated. This idea can be extended to other n-type conducting materials. The non-metallic contacts can be transparent and enable bifacial thin film, like CdTe, solar cells.

The present disclosure focuses on the application of these innovative approaches to solar cells, CdTe thin film in particular, although embodiments are applicable to other devices, such as infrared (IR) detectors and radiation detectors, and even certain light emitting devices.

II. Thin-Film Solar Cells

Embodiments described herein seek to improve practical optoelectronic devices, such as solar cells, which may be susceptible to the Fermi level pinning effect.

FIG. 1 is a band diagram (100) of a crystalline CdTe solar cell using a CdTe/MgCdTe DH design. Curve 155 is associated with the conduction band and curve 175 associated with the valence band. Line 165 depicts the Fermi level. This solar cell achieves $V_{oc}>1$ volt (V) with an ITO/p-aSi:H hole-selective contact layer (shown as layers 110 and 120 in FIG. 1). One advantage of this "remote junction" design is the use of DH to minimize interfacial recombination and to prevent the minority carriers from reaching the counter-part majority carrier contacts to recombine nonradiatively there. This feature has resulted in a record-long carrier lifetime of 3.6 microseconds (μs) and a $V_{oc}$ of 1.11 V, which gives a $V_{oc}$ deficiency $[W_{oc} \equiv (Eg/q) - V_{oc}]$ of only 0.39 electron volt (eV), close to 0.3 eV, 0.37 eV for gallium arsenide (GaAs) and silicon (Si), and much smaller than 0.55 eV for polycrystalline CdTe cells. Another advantage of this design is the use of heavily-doped p-aSi:H, as the p-type contact led to a high built-in voltage ($V_{bi}$) thus enabling a higher $V_{oc}$. Other p-contact layers (ZnTe:As, ZnTe:Cu, and CuZnS) have also been explored. All of them have higher $V_{oc}$ than polycrystalline cells.

A first challenge for CdTe cells to reach a goal of 25% efficiency is lack of materials with large work-function or low valence band edge for hole-selective contact to CdTe. Currently, the useful $V_{oc}$ of polycrystalline CdTe solar cells is still below 0.9 V, most likely due to interface recombination and low $V_{bi}$ ($V_{oc} \leq V_{bi}$). To increase $V_{oc}$ over 1 V, the p-contact needs to have large work-function and low interface recombination, which can be enabled by the "remote junction" approach as described in FIG. 1. A second challenge is the lack of non-destructive measurements of materials properties such as band offset and their correlation to the actual device performance. Despite great progress made in metrologies such as PL, TRPL, TEM, EBIC and their application to control-samples or CdTe-cell characterization, there is often lack of direct correlation between such measurements and device performance to provide meaningful feedbacks to improve device design and manufacturing processes.

Embodiments described herein address these two challenges by using multilayer 2D materials with large work-functions for p-contact layer to improve the $V_{oc}$, FF, and $J_{sc}$, referred to as work-function engineering. Embodiments aim to achieve a set of new records: $V_{oc}>1.18$ V for single-crystal CdTe cells and $V_{oc}>1$ V for polycrystalline-CdTe cells, with efficiency >23%. These challenges are further addressed by building a non-destructive characterization system combined with a device model to quantitatively characterize actual devices and feedback to the optimization of the device design and manufacturing processes.

III. Approaches

A. Work-Function Engineering for p-Contact Using 2D Materials

Consistent with one aspect of this disclosure, a single layer or double-layer stack of transition-metal oxide (TMO) and dichalcogenides (TMD) [(Mo, W)(O, S, Se, Te)], and GaSe 2D materials can be used to tailor the work-function of the contact layer to realize ohmic hole-selective contact with CdTe. This is referred to herein as work-function engineering.

Figure 2:
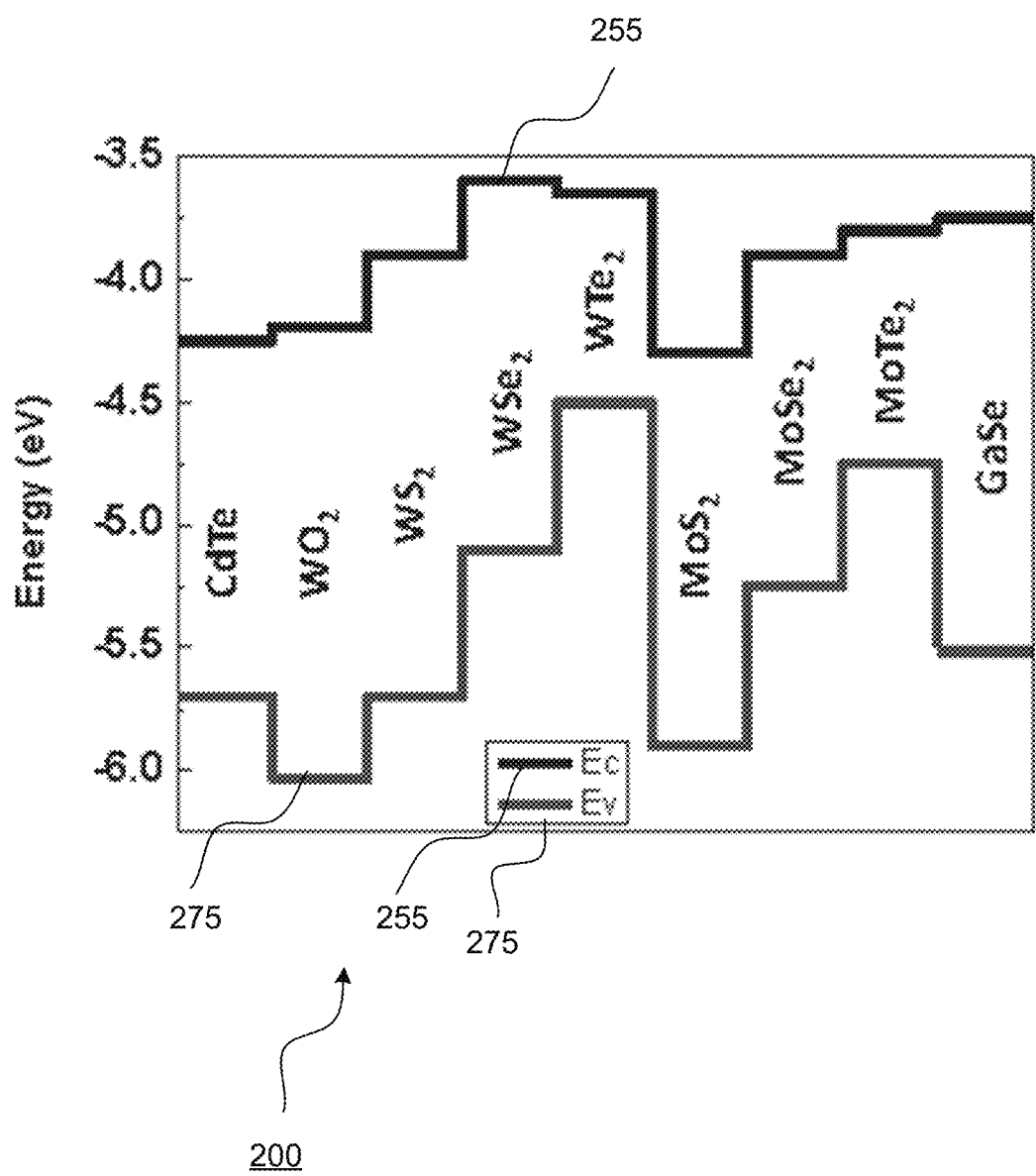
FIG. 2 depicts band-edge alignment of various two-dimensional (2D) materials with CdTe.

FIG. 2 provides graph 200 depicting band-edge alignment of various 2D materials with CdTe. Line 255 is associated with Ec and line 275 associated with Ev. These materials are excellent candidates for hole-selective contact to CdTe as they have highly desirable band offsets with CdTe, both positive and negative. However, since it is challenging to achieve p-type 2D materials, n-type 2D materials instead have been used for Si cells. Si heterojunction cells with an efficiency of 23.5% and a FF~82% have been demonstrated using an ITO/n-MoO$_x$/i-aSi:H p-contact.

Figure 3A:
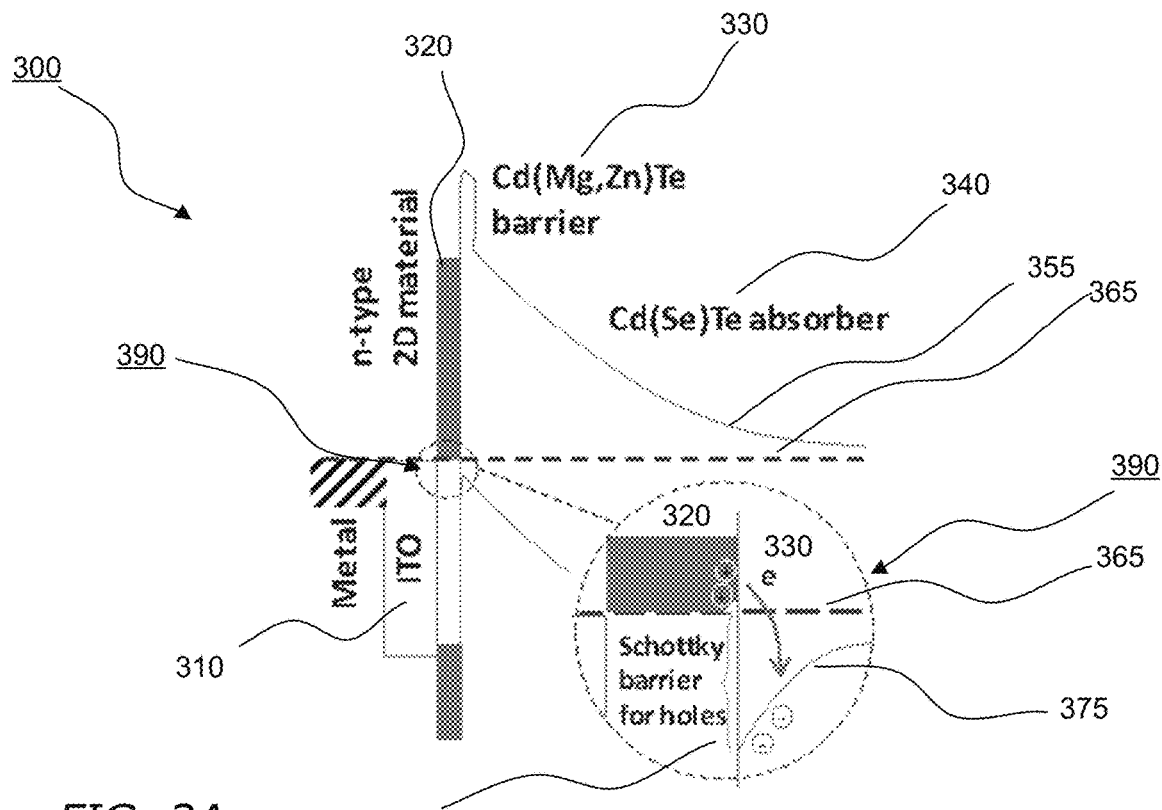
FIGS. 3A and 3B provide schematic diagrams of an n-type 2D material and p-type 2D material (respectively) for hole-selective contact consistent with embodiments disclosed herein.

FIG. 3A provides a schematic diagram (300) of an n-type 2D material (320) for hole-selective contact according to embodiments described herein. As shown in FIG. 3A, layer 310 corresponds to ITO, and layer 320 corresponds to n-type 2D material 320. Barrier 330 corresponds to a Cd(Mg,Zn)Te barrier and absorber 340 corresponds to Cd(Se)Te absorber. Curve 365 is associated with the conduction band and curve 375 (depicted in enlargement schematic 390) is associated with the valence band. Line 365 corresponds to the Fermi level. Also shown in enlargement schematic 390 is Schottky barrier for holes 382. Similar to the structure demonstrated with Si cells, n-type MoO$_x$ can be used as p-contact for CdTe. One advantage is that the n-type MoO$_x$ can be heavily doped with a reasonably large work-function and has a larger Eg than a-Si. The downside is that the work-function is not large enough, so that the Fermi level 365 is still substantially above the CdTe valence band edge (see enlargement schematic 390). Since CdTe cannot be doped p-type heavily, it is inevitable to have a Schottky barrier at the interface with increased contact resistance.

Figure 3B:
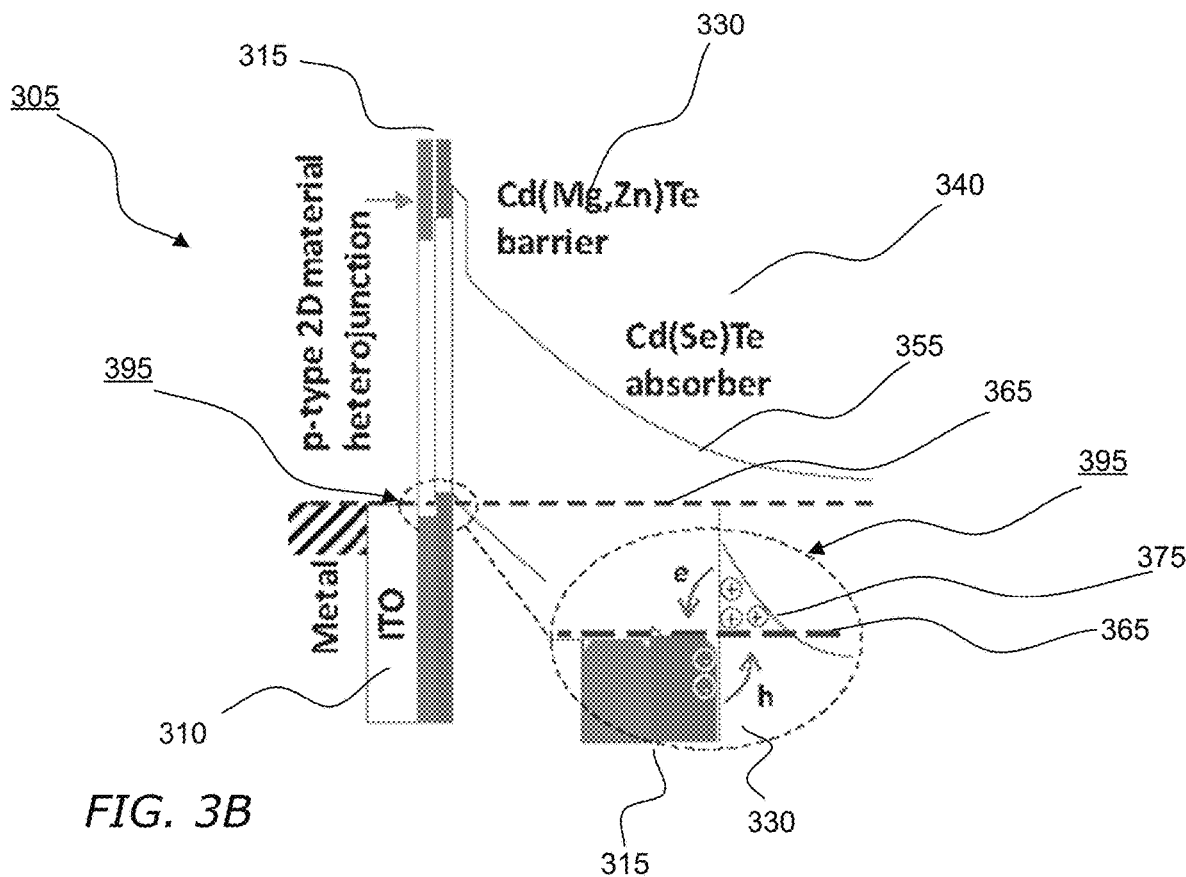

FIG. 3B provides a schematic diagram (305) of a p-type 2D material (320) for hole-selective contact according to embodiments described herein. As shown in FIG. 3B, layer 310 corresponds to ITO, and layer 315 corresponds to a p-type 2D material heterojunction. Barrier 330 corresponds to a Cd(Mg,Zn)Te barrier and absorber 340 corresponds to Cd(Se)Te absorber. Curve 365 is associated with the conduction band and curve 375 (depicted in enlargement schematic 395) is associated with the valence band. Line 365 corresponds to the Fermi level. Consistent with the schematic of FIG. 3B, an alternative approach is to use p-type TMO or TMD 2D materials, which have excellent band alignments with CdTe. As shown in the enlargement schematic 395 in FIG. 3B, the Fermi level 365 of the p-contact can then be tailored to align with or below the valence band edge (where curve 375 is associated with the valence band). Then the holes from the heavily-doped p-type 2D materials like WSe$_2$ will transfer to the neighboring CdTe, lowering the contact resistance to make it ohmic. The choices of alloy compositions in Cd(Se)Te absorber 340 and the Cd(Mg,Zn) Te barrier 330 can make an electron reflector at the interface while maintain a smooth valence band edge.

There are at least 16 pairing combinations available, such as GaSe/(MoO$_2$ or MoS$_2$), WO$_2$/(WSe$_2$ or WTe$_2$), and MoO$_2$/(WSe$_2$ or WTe$_2$). The layer thicknesses are carefully chosen to tailor the Fermi level of the 2D-material stack to properly align with the CdTe valence band edge. This unique "tunability" feature is not available for any other known bulk material and is thus a key advantage of the chosen 2D material systems.

2D material thin films are typically in flakes, which are helpful to concentrate the photocurrent and possess smaller contact areas, and thus reduce the recombination at contact interface as a whole. Furthermore, many of these 2D materials have wider bandgaps than p-aSi:H to minimize the parasitic optical absorption loss. All these advantages drastically improve the $V_{oc}$, as well as FF and $J_{sc}$.

Exemplary embodiments use molecular beam epitaxy (MBE) equipped with an e-beam source and chemical vapor deposition (CVD) to grow single or bilayer 2D materials on crystalline and polycrystalline CdTe. Example 2D materials include $MoO_x$, $WSe_2$, $WTe_2$, and GaSe. Some embodiments use plasma-enhanced CVD (PECVD) for manufacturing processes development.

B. Transparent ITO as Hole Contact

Consistent with another aspect of this disclosure, one can take advantage of the Fermi level pinning effect at the surface/interface. This aspect of embodiments consistent with this disclosure is counterintuitive, but offers substantially high built-in voltage that enables the demonstration of $V_{oc}$ close to 1 V in single crystalline solar cells.

Figure 4:
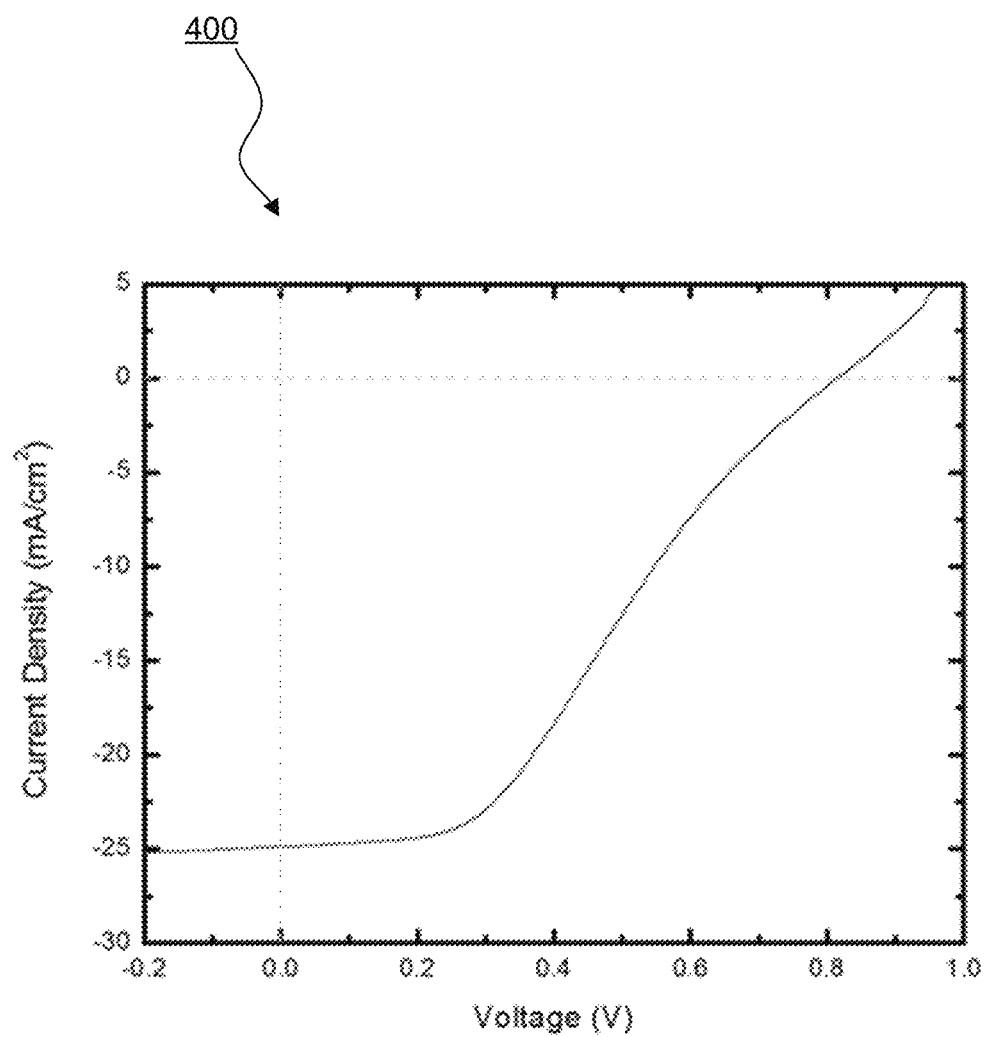
FIG. 4 depicts a current density-voltage (J-V) curve of a solar cell device with indium tin oxide (ITO)/silver (Ag) under 1 sun excitation.

FIG. 4 depicts a graph (400) of a current density-voltage (J-V) curve of a solar cell device with ITO/Ag under 1 sun excitation. ITO/Ag on Sample A1939 at ASU Nanofab was used to obtain the first J-V curve under 1 sun luminescence.

Figure 5:
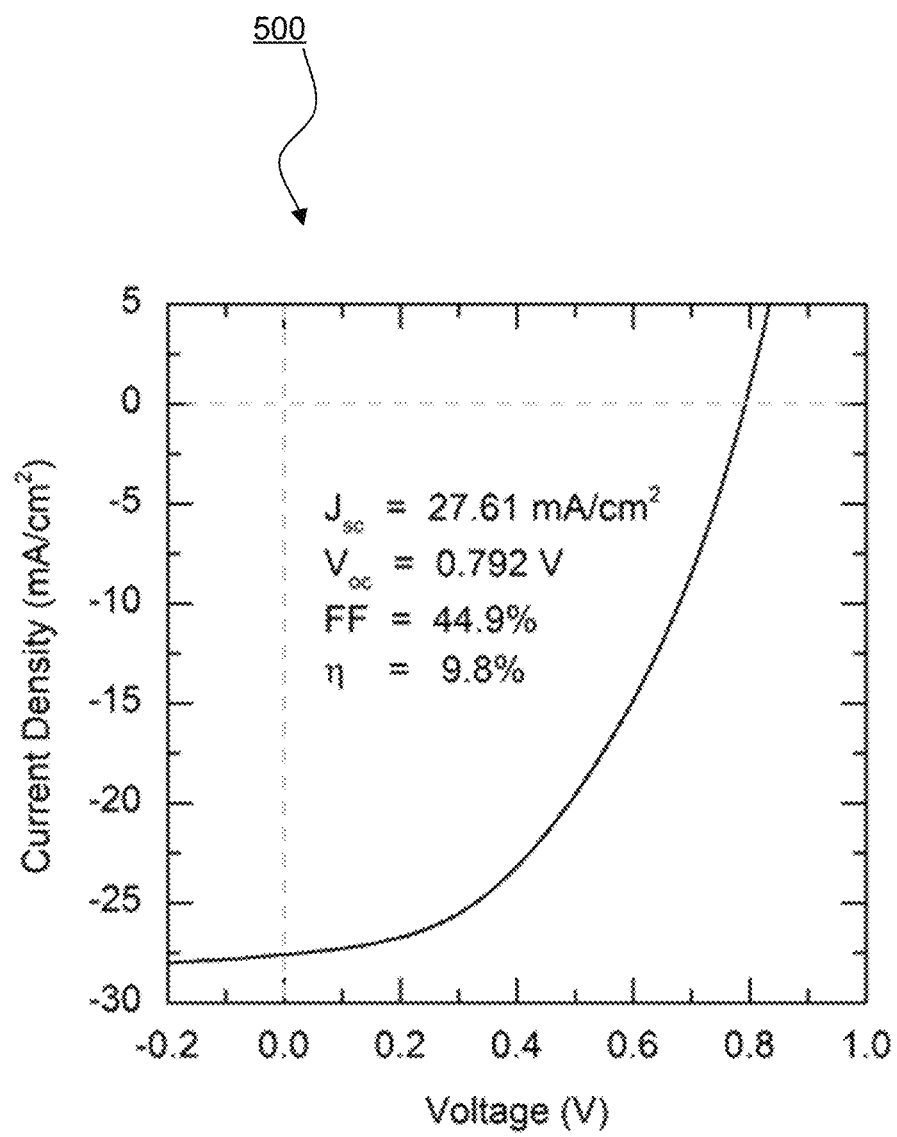
FIG. 5 depicts a J-V curve of a solar cell device with ITO on top of lift-off thin film under 1 sun excitation.

FIG. 5 depicts a graph (500) of a J-V curve of a solar cell device with ITO on top of lift-off thin film under 1 sun excitation. The first ultra-thin-film CdTe solar cell was demonstrated using ITO directly deposited on post-ELO MgCdTe/CdTe DH structure (A1942, lift-off sample). This solar cell utilizes the Fermi level pinning concept to form a p-n junction using direct deposition of ITO on n-type MgCdTe.

C. Nondestructive Characterization System

Almost all the p-contacts for CdTe cells are not ohmic and can be viewed as a Schottky junction. To better study the effectiveness of the TMO and TMD 2D material stack as a p-contact layer, it is necessary to quantitatively measure the Schottky barrier height, which is related to the band offset between the p-contact and the CdTe valence band. Such a measurement is not always performed.

Figure 6:
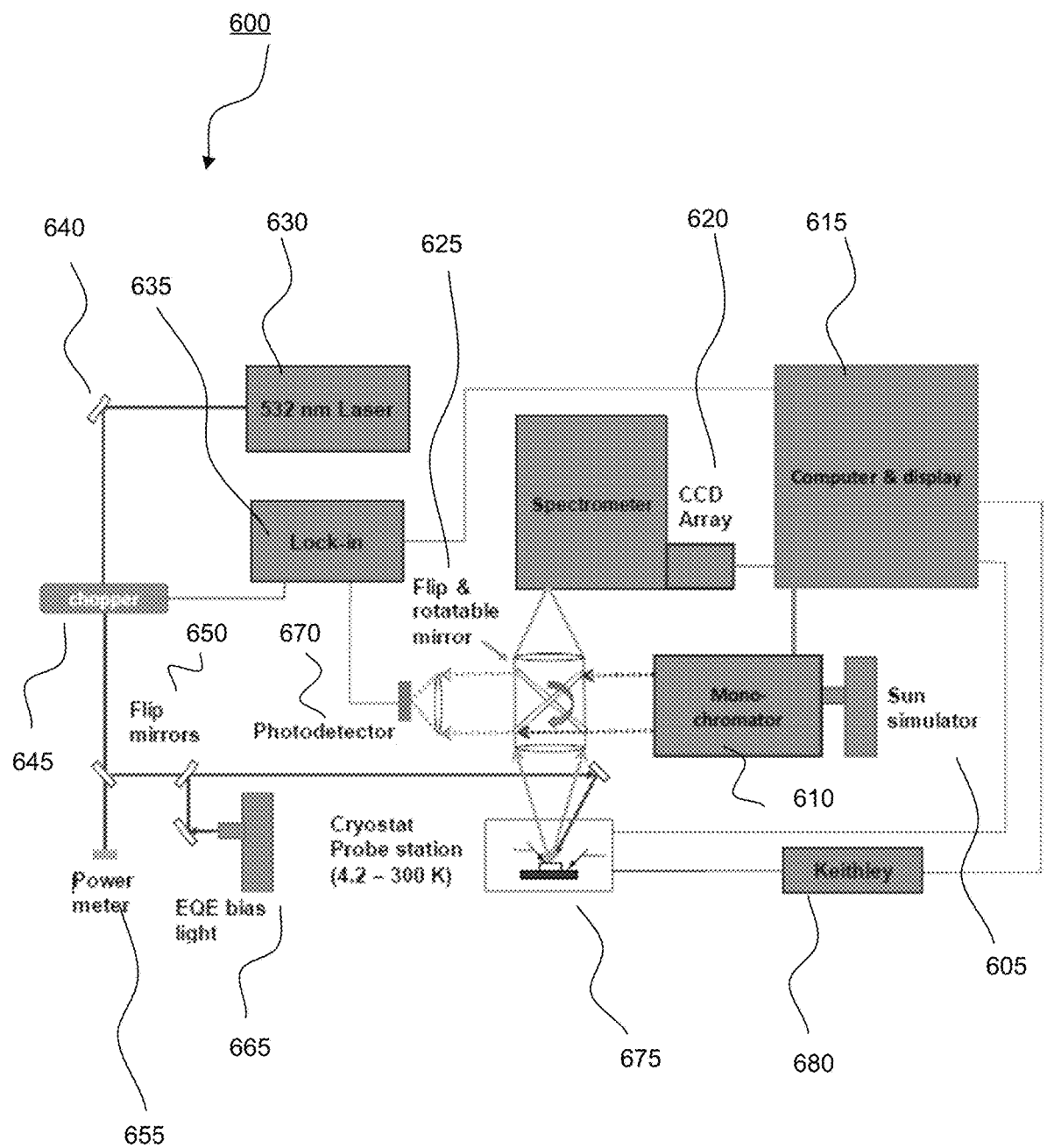
FIG. 6 depicts a non-destructive characterization system for temperature- and excitation-dependent J-V, external quantum efficiency (EQE), and implied open circuit voltage ($iV_{oc}$) measurements.

FIG. 6 is a schematic block diagram of a non-destructive characterization system 600 for temperature- and excitation-dependent J-V, external quantum efficiency (EQE), and implied open-circuit voltage $iV_{oc}$ measurements. System 600 can provide an accurate determination of many critical device and material parameters and relates them to the actual cell performance. An example measurement is illustrated in FIG. 5. Components of system 600 can include: computer and display 615 (for data acquisition, storage, and control of various components of system 600), CCD array and spectrometer 620, Sun simulator 605 and monochromator 610, lock-in amplifier 635, laser 630, and light chopper 645, various mirrors 640 and flip mirrors 650, photodetector 670 and flip and rotatable mirror 625, and cryostat probe station 675 (with a temperature range 4.2-300 K).

Figure 7:
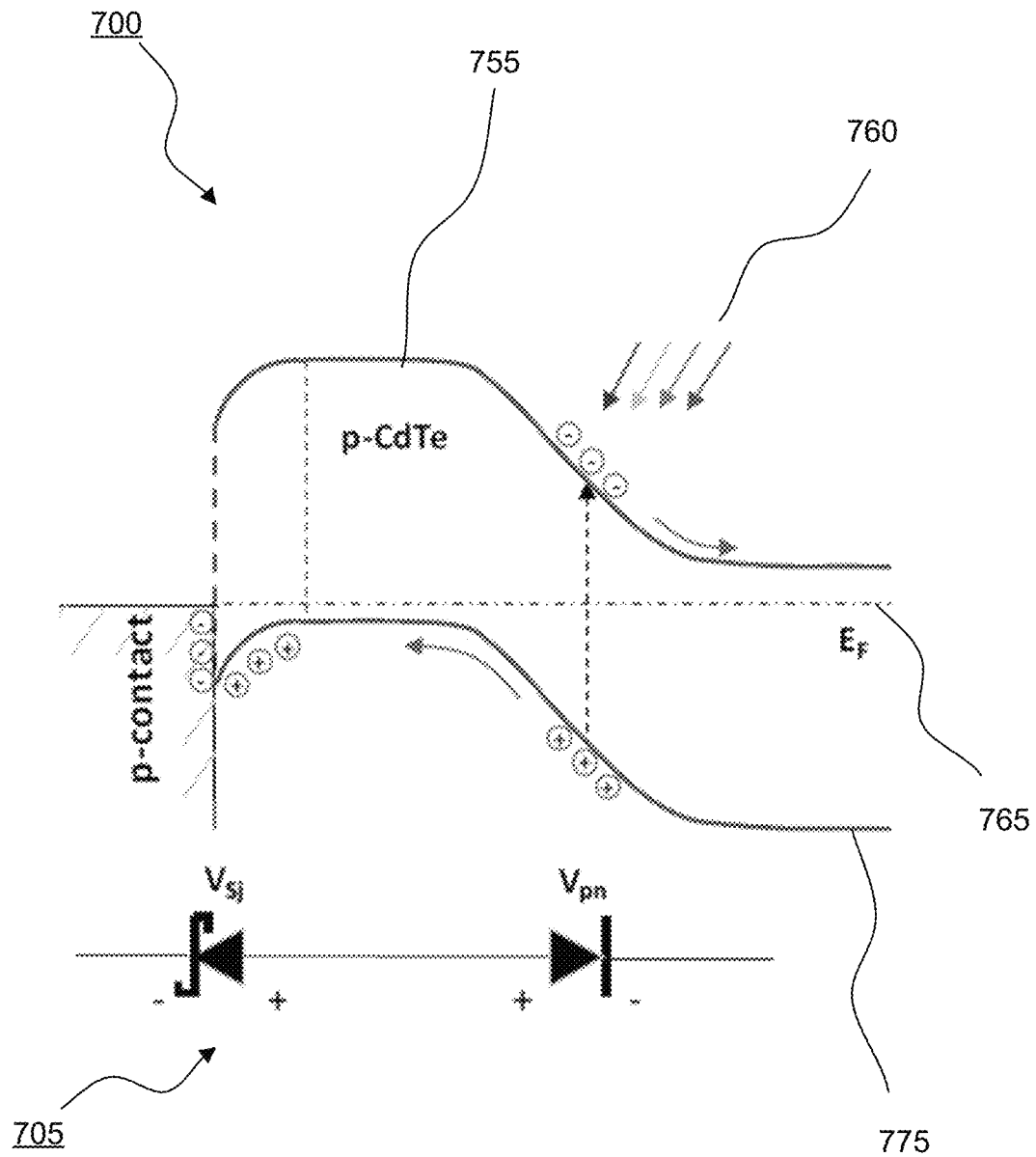
FIG. 7 depicts a band diagram of a CdTe cell with a non-ohmic p-contact and its Schottky diode equivalent circuit consistent with aspects of the embodiments disclosed herein.

FIG. 7 depicts a band diagram (700) of a CdTe cell with a non-ohmic p-contact and its Schottky diode equivalent circuit (705). Curve 755 represents the conduction band and curve 775 represents the valence band. The Fermi level is depicted as line 765. A non-ideal p-contact is assumed to be a Schottky diode. Since p-type doping of CdTe is difficult and the hole-Fermi level lies substantially above the valence band edge, there will be a Schottky barrier formed at the p-contact/CdTe interface. Under optical excitation 760, photogenerated holes will accumulate in the CdTe near the interface and result in a voltage drop across the Schottky junction. The device can then be viewed as a Schottky diode and a p-n junction with opposite polarities connected in series as shown by the equivalent circuit (705).

Figure 8:
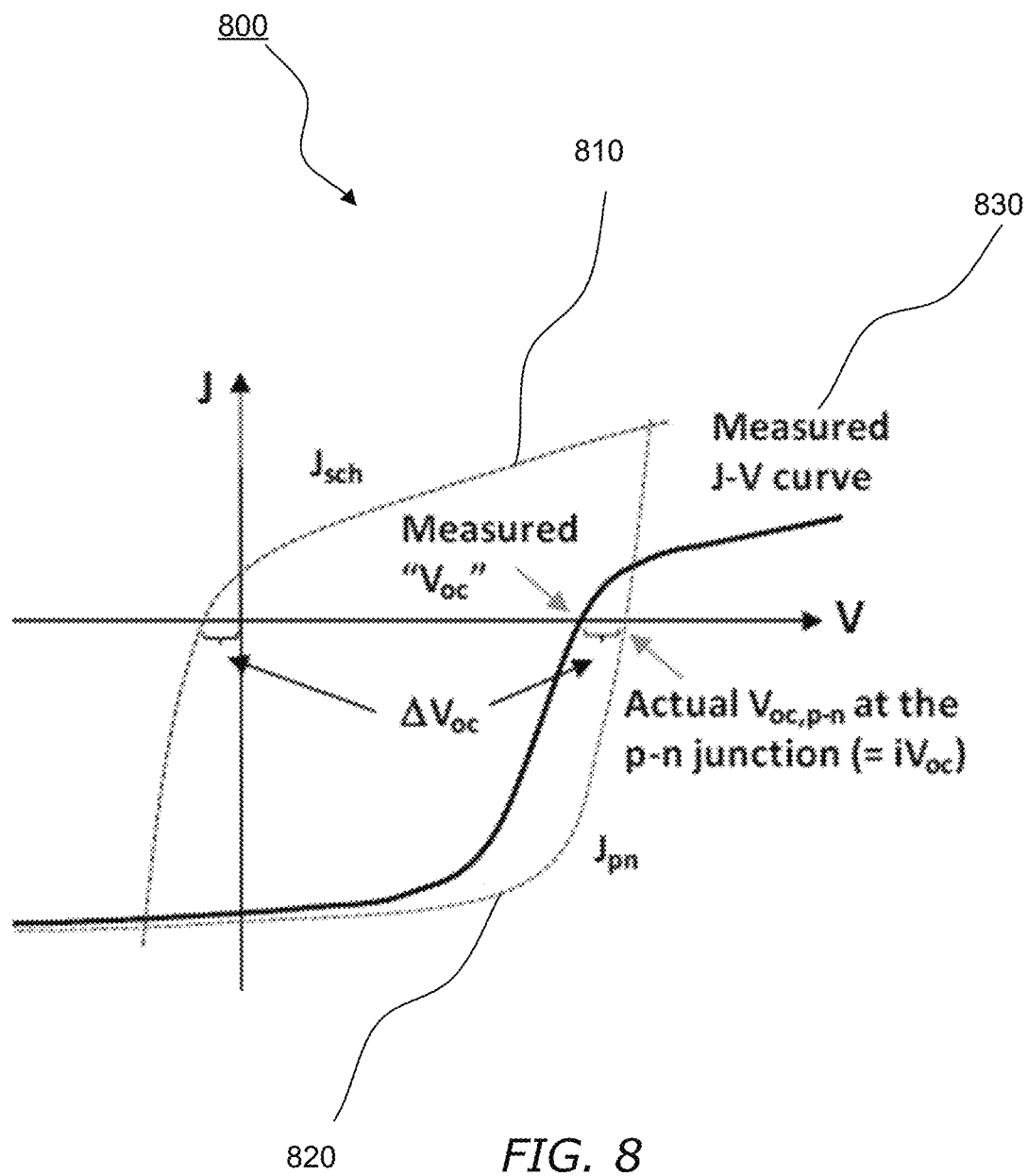
FIG. 8 depicts a J-V curve of the CdTe cell of FIG. 7 modeled as a Schottky and a p-n junction with opposite polarity connected in series.

FIG. 8 depicts a J-V curve 830 of the CdTe cell of FIG. 7 modeled as a Schottky diode and a p-n junction with opposite polarities connected in series. The J-V curve of the entire device (curve 830) is the combined result of the Schottky diode (curve 810) and the p-n junction (curve 820). This model reveals several important features. First, the J-V curve (curve 810) for the Schottky diode is shifted due to its photocurrent. The $V_{oc,Sch}$ ($=\Delta V_{oc}$) of the Schottky diode has a negative sign compared with the $V_{oc,p-n}$ of the p-n junction. Therefore, the measured $V_{oc}$ of the entire device is $V_{oc,p-n}-\Delta V_{oc}$, lower than the actual $V_{oc,p-n}$ of the p-n junction PV cell. As discussed above, the actual $V_{oc,pn}=iV_{oc}$ can be accurately determined through quantitative PL measurements. It is worth pointing out that the model used in previous works for $iV_{oc}$ measurement on crystalline CdTe may not be directly applied to polycrystalline materials and solar cells without modification because that latter has a non-ideal surface flatness and poor back-surface reflectivity.

Second, by fitting the curve using the Schottky diode equation $$J = J_{ph} - A * T^2 e^{-\frac{q\phi}{kT}}\left(e^{-\frac{qV}{kT}} - 1\right),$$

one can get the Schottky barrier height $\phi$. When $$A * T^2 e^{-\frac{q\phi}{kT}} \ll J_{ph}, \text{ then } \Delta V_{oc} \approx \frac{kT}{q}\ln\left(J_{ph}/\left(A * T^2 e^{-\frac{q\phi}{kT}}\right)\right),$$

which quantitatively explains the $V_{oc}$~T behavior as shown below.

Figure 9:
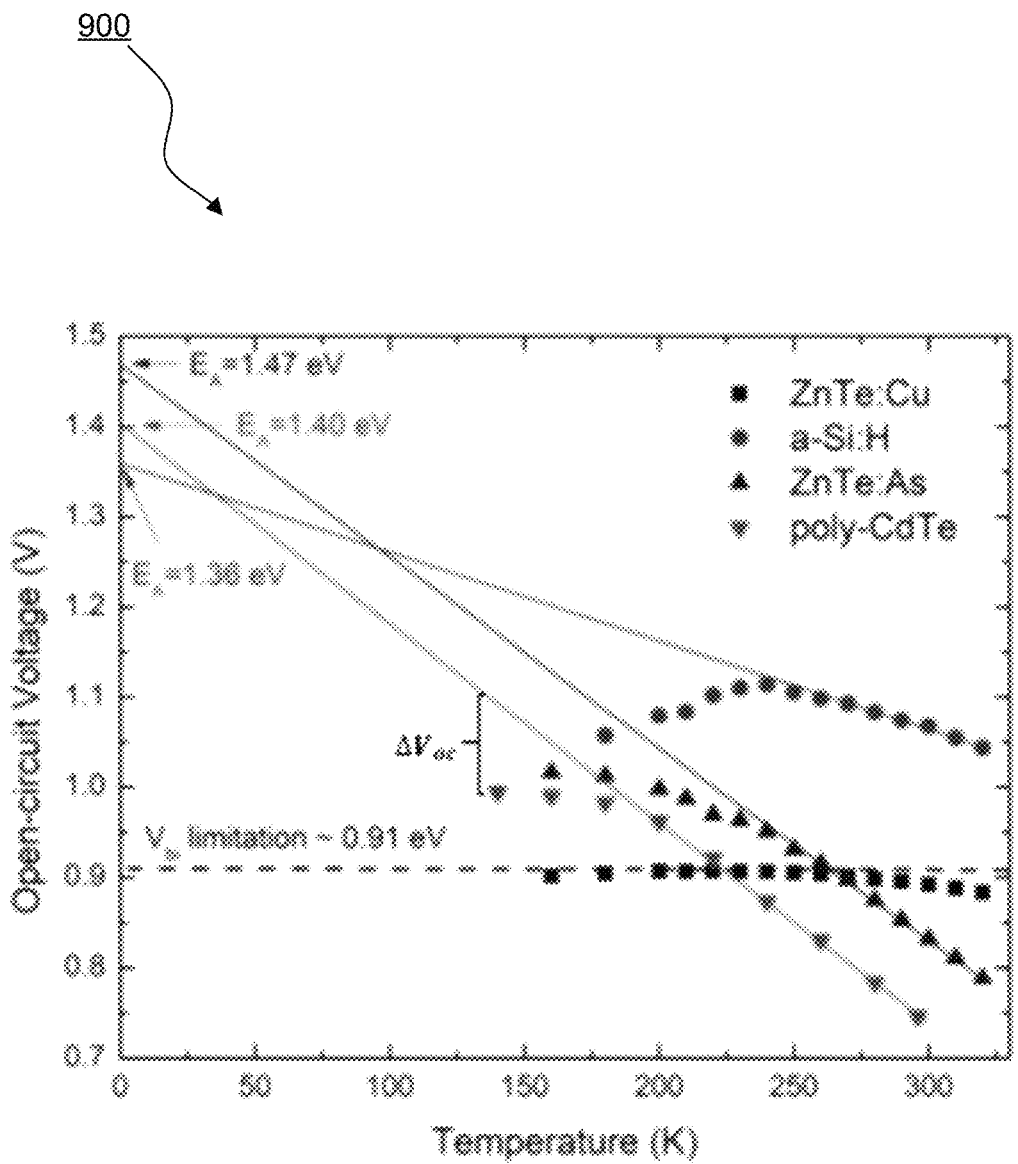
FIG. 9 depicts temperature-dependent open circuit voltage ($V_{oc}$) measurements of three crystalline CdTe/MgCdTe DH cells with different p-contact layers.

FIG. 9 depicts graph 900, which provides temperature-dependent $V_{oc}$ measurements of three crystalline CdTe/MgCdTe DH cells with different p-contact layers. The typical temperature dependent behaviors of $V_{oc}$ are shown for both single-crystal and polycrystalline CdTe solar cells. For the cells with a ZnTe:Cu contact layer, which has a lower p-type doping profile, the $V_{oc}$ is limited by the low $V_{bi}$, indicating the importance of high p-type doping in the p-region. The other three curves for devices with different p-contact layers (a-Si:H, ZnTe:As, and Cu/Au contact for the poly cell) all show roll over behavior as temperature decreases below 250 Kelvin (K). This behavior is attributed to the voltage drop across the interfacial Schottky barrier and can be quantitatively described by using the model given above. The barrier height can then be accurately measured. These findings confirm the fact that for CdTe solar cells, it can be challenging to find a material that has a large enough work-function or electron affinity for an ohmic hole contact. Therefore, the proposed embodiments using work-function engineering offer a major breakthrough.

Those skilled in the art will recognize improvements and modifications to the preferred embodiments of the present disclosure. All such improvements and modifications are considered within the scope of the concepts disclosed herein and the claims that follow.

What is claimed is:
1. An optoelectronic junction, comprising:
a thin-film doped semiconductor; and
a p-contact layer comprising a two-dimensional (2D) material deposited at an interface of the thin-film doped semiconductor forming the optoelectronic junction, a thickness of the two-dimensional (2D) material being chosen to tailor a Fermi level of the two-dimensional (2D) material to overlap or fall below a valence band edge of the thin-film doped semiconductor at the interface, wherein the thin-film doped semiconductor comprises a p-type semiconductor, wherein the p-contact layer comprising the two-dimensional (2D) material comprises a single-layer p-type material or a double-layer p-type material, and wherein the optoelectronic junction is a p-p+ junction.

2. The optoelectronic junction of claim 1, wherein the two-dimensional (2D) material induces a sufficiently high electrical field inside the thin-film doped semiconductor to extract photogenerated carriers from the optoelectronic junction or inject minority carriers into the optoelectronic junction.

3. The optoelectronic junction of claim 1, further comprises indium tin oxide disposed over the p-contact layer forming an ohmic contact.

4. The optoelectronic junction of claim 1, wherein the p-contact layer comprises a doped Cu/Au.

5. The optoelectronic junction of claim 1, wherein the two-dimensional (2D) material comprises one of ZnTe:As, ZnTe:Cu, or CuZnS.

6. The optoelectronic junction of claim 5, wherein the p-contact layer comprises:
a pre-selected work-function and a pre-selected interface recombination.

7. The optoelectronic junction of claim 1, wherein the p-contact layer comprises:
a single layer or double-layer stack of transition-metal oxide (TMO) and dichalcogenides (TMD) [(Mo, W)(O, S, Se, Te)], and GaSe two-dimensional (2D) materials configured to tailor a work-function of the p-contact layer to realize ohmic hole-selective contact with CdTe.

8. A method for forming a thin-film optoelectronic device, the method comprising:
providing a thin-film doped semiconductor; and
creating a p-contact layer by depositing a two-dimensional (2D) material at an interface of the thin-film doped semiconductor to form an optoelectronic junction,
wherein a thickness of the two-dimensional (2D) material being chosen to tailor a Fermi level of the two-dimensional (2D) material to overlap or fall below a valence band edge of the thin-film doped semiconductor at the interface,
wherein the thin-film doped semiconductor comprises a p-type semiconductor,
wherein the p-contact layer comprising the two-dimensional (2D) material comprises a single-layer p-type material or a double-layer p-type material, and
wherein the optoelectronic diode junction is a p-p+ junction.

9. The method of claim 8, further comprising:
depositing indium tin oxide over the p-contact layer forming an ohmic contact.

10. The method of claim 8, wherein the two-dimensional (2D) material induces a sufficiently high electrical field inside the thin-film doped semiconductor to extract photogenerated carriers from the optoelectronic diode junction or inject minority carriers into the optoelectronic diode junction.

11. The method of claim 10, wherein the two-dimensional (2D) material comprises one of:
ZnTe:As, ZnTe:Cu, or CuZnS).

12. The method of claim 8, wherein the p-contact layer comprises a doped Cu/Au.

13. The method of claim 12, wherein the p-contact layer comprises:
a pre-selected work-function and a pre-selected interface recombination.

14. A contact for a solar cell comprising a thin-film doped semiconductor, the contact comprising:
a p-contact layer including a two-dimensional (2D) material deposited at an interface of the thin-film doped semiconductor forming an optoelectronic junction, a thickness of the two-dimensional (2D) material being chosen to tailor a Fermi level of the two-dimensional (2D) material to overlap or fall below a valence band edge of the thin-film doped semiconductor at the interface; and
indium tin oxide disposed over the p-contact layer forming an ohmic contact,
wherein the thin-film doped semiconductor comprises a p-type semiconductor,
wherein the p-contact layer comprising the two-dimensional (2D) material comprises a single-layer p-type material or a double-layer p-type material, and
wherein an optoelectronic junction including the thin-film doped semiconductor and the p-contact layer is a p-p+ junction.

15. The contact of claim 14, wherein the two-dimensional (2D) material induces a sufficiently high electrical field inside the thin-film doped semiconductor to extract photogenerated carriers from the optoelectronic junction or inject minority carriers into the optoelectronic junction.

16. The contact of claim 14, wherein the p-contact layer comprises a doped Cu/Au.

17. The contact of claim 14, wherein the two-dimensional (2D) material comprises one of ZnTe:As, ZnTe:Cu, or CuZnS.

18. The contact of claim 14, wherein the p-contact layer comprises a pre-selected work-function and a pre-selected interface recombination.

19. The contact of claim 14, wherein the p-contact layer comprises a single layer or double-layer stack of transition-metal oxide (TMO) and dichalcogenides (TMD) [(Mo, W)(O, S, Se, Te)], and GaSe two-dimensional (2D) materials configured to tailor a work-function to realize ohmic hole-selective contact with CdTe.

\* \* \* \* \*